United States Patent [19]

Melpolder et al.

[11] Patent Number: 5,294,288
[45] Date of Patent: Mar. 15, 1994

[54] FORMING SOL-GEL DICHROIC COLOR FILTERS

[75] Inventors: Sharon M. Melpolder, Hilton; Michael J. Hanarahan; Anne W. West, both of Rochester, all of N.Y.

[73] Assignee: Eastman Kodak Company, Rochester, N.Y.

[21] Appl. No.: 794,687

[22] Filed: Nov. 18, 1991

Related U.S. Application Data

[62] Division of Ser. No. 609,567, Nov. 5, 1990, abandoned.

[51] Int. Cl.$^5$ .............................. C30B 7/02
[52] U.S. Cl. ............................ 156/621; 156/600; 156/603; 437/132
[58] Field of Search ............... 357/30 FD; 501/134; 156/600, 603, 621; 437/132

[56] References Cited

U.S. PATENT DOCUMENTS 4,476,156  10/1984  Brinker et al. ............. 427/82
4,829,031  5/1989  Raj et al. .................. 423/610

OTHER PUBLICATIONS

Lottiaux et al., "Morphology and Structure of TiO$_2$ Thin Layers vs. Thickness and Substrate Temperatures", Thin Solid Films vol. 170 (1989) pp. 107-126.

Partlow, D. P. et al., "Thirty-Seven Layer Optical Filter from Polymerized Solgel Solutions," Applied Optics, vol. 29, No. 10, Apr. 1, 1990, 1526-1529.

Primary Examiner—Robert Kunemund
Attorney, Agent, or Firm—Raymond L. Owens

[57] ABSTRACT

A process of forming dichroic color filters on substrates, particularly image sensors, includes using a spin-on-glass process to form low and high refractive index layers. A mixture of titania and silica partially hydrolyzed and condensed sol-gel polymer suspension in the high refractive index layer and in the low refractive index layer has a partially hydrolyzed and condensed silica sol-gel polymer suspension are processed and to cause titania to phase change.

1 Claim, 4 Drawing Sheets

FORMING SOL-GEL DICHROIC COLOR FILTERS

This is a division of application Ser. No. 609,567 filed Nov. 5, 1990 now abandoned.

FIELD OF THE INVENTION

This invention relates to making color dichroic filters, particularly on image sensors.

BACKGROUND OF THE INVENTION

Color filters have a number of applications in which control of the spectral characteristics of a light source is desirable. For example, color filter arrays are employed in combination with image sensors to define color images or in combination with display devices to permit color images to be viewed. Whenever the term "image sensor", is used in the specification or claims, it will be understood to include display devices. A common approach to producing color filters has been to use organic dyes embedded in a layer. This approach has two significant disadvantages. The spectral characteristics of the filter are controlled by the absorbance curves of the dye and layer materials. Altering the spectral characteristics, therefore, requires altering the dye or layer material, which can be a difficult and time-consuming process. Furthermore, the dyes may be subject to fading with time, especially under harsh environmental operating conditions such as high light levels, etc.

An alternative, which overcomes the disadvantages of the organic-dye approach, has been to produce color filters from interference filters made up of alternate layers of two dielectric materials with different refractive indices. For purposes of this disclosure, the term "dichroic" will be understood to refer to a filter which has alternate layers of dielectric materials with different refractive indices. Various combinations of pairs of dielectric materials and deposition techniques have been used. One particular interference filter uses refractory oxides (i.e., silicon dioxide and titanium dioxide). These materials are deposited by evaporation or sputtering techniques. This is not only an expensive process, but to control the filter spectral characteristics, only the thickness of the layer can be changed. Another problem associated with image sensors, is that the materials are usually deposited at significantly greater temperatures than desirable for final manufacturing step normally associated with sensors. Excessive heating may damage the metallization used for electrical conduction in the image sensor. Therefore, the general approach has been to fabricate filters from these materials onto glass substrates and then attach the filters to devices using adhesives. Pattern transfer techniques may also be required, making the process complicated and cumbersome. Lower temperature deposition techniques for these materials are not known.

It is, of course, highly desirable to integrally make dichroic filters on an image sensor. Also, the number of processing steps in critical process controls should be minimized. Wherever possible, etch chemistries should be eliminated. It should be noted that both wet and dry etching techniques require many process controls and have to be monitored and maintained to provide an effective and safe manufacturing environment.

Another method of making multilayer optical filters using multilayer structures formed by heat treating sol-gel solutions. The filter is annealed each time a layer is applied. See Partlow et al, Thirty-seven Layer Optical Filter From Polymerized Sol-gel Solutions, Vol. 29, No. 10, Applied Optics (April 1990) and U.S. Pat. No. 4,476,156 to Brinker et al. This method is effective for making filters, but here again it is difficult to control filter spectral characteristics.

SUMMARY OF THE INVENTION

It is therefore an object of this invention to provide an improved sol-gel process for making dichroic color filters with improved spectral characteristics.

Another object is to make sol-gel dichroic integral filters on image sensors with improved spectral characteristics.

These objects are achieved in a process for forming a dichroic color filter comprising the steps of sequentially depositing a plurality of spin-on layers wherein two of such spin-on layers have different desired indices of refraction with one including a mixture of titania and silica partially hydrolyzed and condensed sol-gel polymer suspension and the other a partially hydrolyzed and condensed silica sol-gel polymer suspension, and after depositing each layer, heating such layer at a temperature less than 300° C. to remove residual solvent and to prevent exposing the layer containing titania to energy selected to cause titania to phase change from amorphous to either crystalline anatase or rutile or a combination thereof to change the spectral response characteristics of the filter.

An important feature of this invention is that integral dichroic filters can be formed on image sensors with improved spectral characteristics.

BRIEF DESCRIPTION OF THE DRAWINGS

The invention can be better appreciated by reference to the following description of a preferred embodiment considered in conjunction with the drawings, in which.

MODES OF CARRYING OUT THE INVENTION

Figure 1:
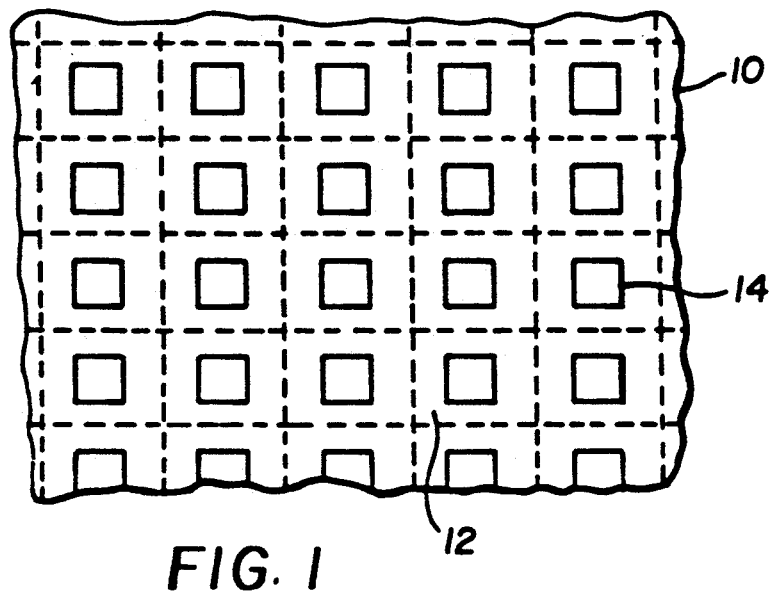
FIG. 1 is a plan view of a multipixel semiconductor image sensor.

In FIG. 1, a multipixel dichroic color filter array 10 is shown formed on an image sensor having a plurality of photodiodes 14.

The image sensor can be viewed as being made up of a plurality of sensing elements or pixels 12, each having a centrally positioned photodiode 14.

Figure 2:
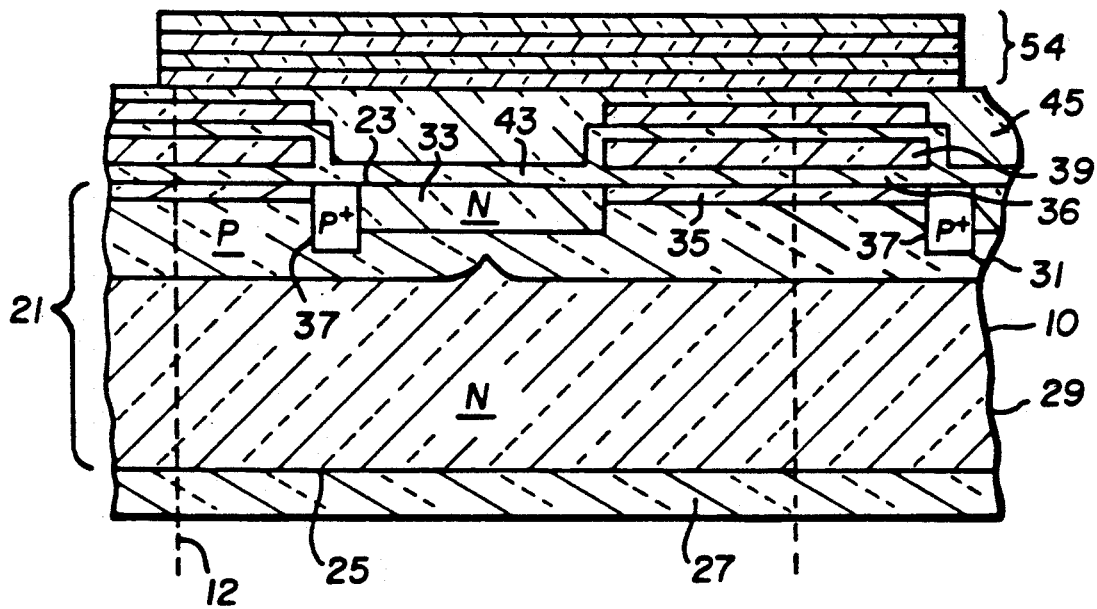
FIG. 2 is a sectional view of a single sensing element just after forming an integral dichroic filter on the planarization layer.

Turning now to FIG. 2, we see in cross-section a representative sensing element or pixel 12 of the image sensor. It should be noted that in this figure an integral sulfide layer dichroic filter 10 in accordance with the invention has been added on the image sensor. A semiconductive substrate 21, typically a monocrystalline silicon substrate, is shown having an upper major surface 23 and a lower major surface 25. A conductive layer 27 covers the lower major surface. The semiconductive substrate 21 has an N-conductivity-type region 29 and a P-conductivity-type well 31 formed by a diffusion from the upper major surface 23. A photodiode 14 is formed centrally in the pixel by an N-diffusion 33 from the upper major surface. The function of a photodiode is to produce electrons in proportion to the amount of light received on exposure.

Electrons are supplied to an adjacent charge-couple device. To create a buried channel for electron transfer, a shallow N-conductivity-type region 35 is located adjacent the upper major surface. The buried channel thus formed extends from the diode to an adjacent CCD. To prevent unwanted lateral charge conductions, P+-conductivity-type zones 37, referred to as channel stops, isolate the photodiode and the adjacent CCD from other adjacent surface structures. A gate electrode 39, typically formed of polycrystalline silicon, is shown overlying a gate insulator 36 which overlies the upper surface of the semiconductive substrate. Because polycrystalline silicon is transparent, a light shield 41, typically formed of aluminum, overlies the gate electrode. A transparent insulator 43 is shown overlying the entire upper major surface of the semiconductive substrate and also separating the gate electrodes from the light shields. Typically, the insulator is silicon dioxide, with a surface laid down of passivant such as borosilicate glass being common. Although shown as a unit, the insulators are typically formed in several successive fabrication steps. The topography of the surface of the image sensor 10 is quite irregular. Accordingly, transparent planarization layer 45 is positioned to provide a smooth surface 47. On the smooth surface are provided a plurality of spin coated layers which comprise the filter 48.

Figure 3A:
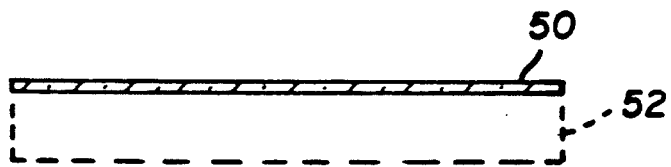
FIG. 3 (a-d) are cross-sectional views of alternating layers of a high and low refractive index sol-gel film at various stages of the dichroic filter fabrication process.
Figure 3B:
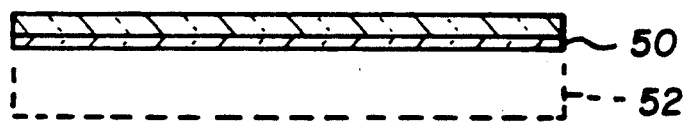
Figure 3C:
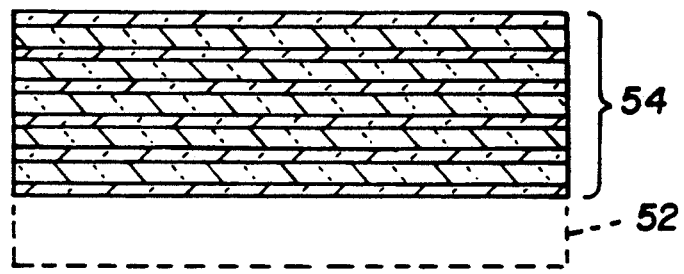
Figure 3D:
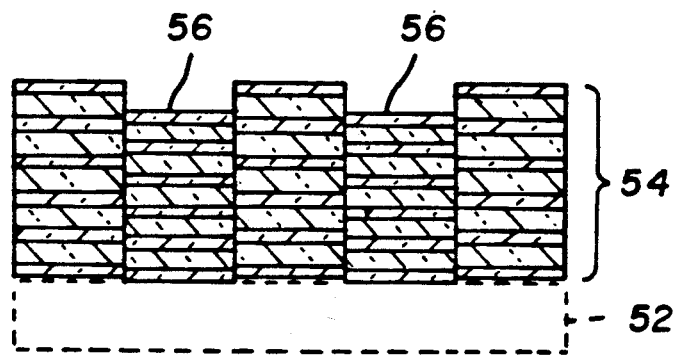

Sol-gel or spin-on glass is a chemical process for producing inorganic oxide layer or films of various glass, ceramic or composite compositions. The temperatures used to produce non-porous densified films are well below those ordinarily used to grow similar films using plasma/furnace techniques. An inorganic or organic-modified inorganic precursor materials such as tetraethyl orthosilicate or methyl triethyl orthosilicate are hydrolyzed and condensed in the presence of either acid or base catalyst and a cosolvent i.e. an alcohol. Sol-gel materials that are synthesized are usually low in viscosity, i.e. 2-3 cp- Based on the concentration of the inorganic sol-gel polymer, its molecular weight, spin speed used; layers varying in thickness from a few hundred angstroms to approximately a micron can be spin-coated onto various substrates such as an image sensor. The substrate and underlying layers of the device determine the upper processing temperature of the spin-on-glass layers. In this application, an upper processing temperature of 200° C. is used for a time of less than 2 minutes. The low refractive index sols-gel suspension consists of a hydrolyzed and condensed pure silica polymer and the high refractive index sol-gel is composed of a combination of hydrolyzed and condensed titanium and silicon sol-gel suspensions such that the desired refractive index is obtained under the specific processing conditions used. Referring to FIG. 3a, the process consists of spin coating the first layer 50 onto a substrate or image sensor 52 using an aliquot of a specific sol-gel concentration at a specific spin speed for less than 2 minutes. The layer 50 is contact baked for less than 2 minutes by placing the substrate onto a block which is heated to a specific temperature and holding the substrate in contact by the application of a vacuum to the backside of the substrate. The initial bake processing removes the majority of the solvent (i.e., alcohol) and causes the SOG layer to gel on the substrate. If the application calls for more layers, the other sol-gel composition is then spin coated over the baked previous layer to obtain the desired layer thickness as shown in FIG. 3b. A similar baking sequence is followed providing a desired alternating high/low layer stack 54 (see FIG. 3c). The previous steps are repeated as needed. As shown in FIG. 3d, portions of the stack 54 are removed exposing the top surface of the substrate 52 and different dichroic filters 56 are formed in such openings (see FIG. 3d).

To avoid cracks, etc. forming due to residual stresses in the films, the substrate may be annealed off-line at a similar temperature provided in the contact bake step discussed above. The term "anneal" refers to heating the substrate to a specific temperature for a longer time than the "contact bake" followed by a slow cooling step to room temperature. After slow cooling to room temperature, a desired number of remaining layers are coated and processed as before. A final anneal may or may not be used after the last layer is coated and prebaked.

The baking conditions used in this example do not result in fully consolidated non-porous inorganic oxide films but a complicated mixture of inorganic oxide and organometallic hydroxide, alkoxide, oxide, etc., i.e.

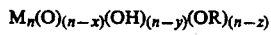

$$M_n(O)_{(n-x)}(OH)_{(n-y)}(OR)_{(n-z)}$$

such that $x+y+z=n$ wherein M=inorganic atom and n=valence of M. Processing to higher temperatures will result in full condensation and consolidation to an inorganic oxide with a resulting refractive index indicative of the amorphous or crystalline inorganic oxide composition.

The spin-coated dichroic filter array may be exposed to additional energy by heating, in the form of thermal, laser, infrared, microwave, rapid thermal infrared, etc. or a combination to cause a change in phase of the titania present in the high refractive index layer to either rutile, anatase or a combination of both crystalline phases. Change in phase results in an increase in refractive index of the high refractive index layer that is dependent on the crystalline size and density and concentration of the crystallite component. The change in refractive index will cause the spectral characteristics of the color filter array device to shift to shorter wavelength. The silica will not crystallize under conditions used. The number of layers of high and low refractive index, the thickness of each layer, the temperature and time of processing all aid in the definition of the final spectral response of the dichroic filter.

The process described provides advantages in that it can be readily used to control the thickness and refractive index of the various layers of material which produce the dichroic filter. The spin-on glass solution also provides another important feature in that it can suspend a mixture of materials which also affect the refractive index. Various single and multi-component sol-gel compositions can be made in order to have variable range of refractive index and dispersion. Examples of the sol-gel and the resultant optical properties are listed below: Varying the ratio of silica and titania in a binary composition can result in an amorphous refractive index from as low as 1.43 to as high as 2.3. The change in phase of the titania from amorphous to either anatase, rutile or a combination of the two phases can raise the refractive index to greater than 2.5. Alternative network forming and network modifying substituent compositions can incorporate sodium (NM), boron (NF), calcium (NM), potassium (NM), aluminum (NF), germanium (NF), tantalum (NF), cesium (NM), lead (NFINM) and other oxides and materials known in the glass forming industry to vary the refractive index in a manner similar to what is obtained by using traditional melt processing techniques to prepare glass or ceramic materials having different refractive index and dispersion as a function of wavelength.

Another factor which will affect the refractive index of each layer of the integral dichroic filter is the temperature and time at which the spin-on glass layers are heated. The refractive index of a particular composition of a sol-gel spin-on glass can be modified by the densification of the film as the porosity of the film changed. In the case of an 80/20 mole % titania/silica sol-gel the refractive index can vary from 1.70 to 2.05 of an amorphous film. In all cases the films have remained amorphous as determined from x-ray diffraction spectroscopy and cross-sectional transmission electron microscopy (TEM). Additional heating or other influx of energy can transform the amorphous titania component to crystalline anatase, rutile or a combination of two phases. This resulted in an increase of the layer's refractive index to 2.23 and the crystallites were less than 200 Å.

Figure 4:
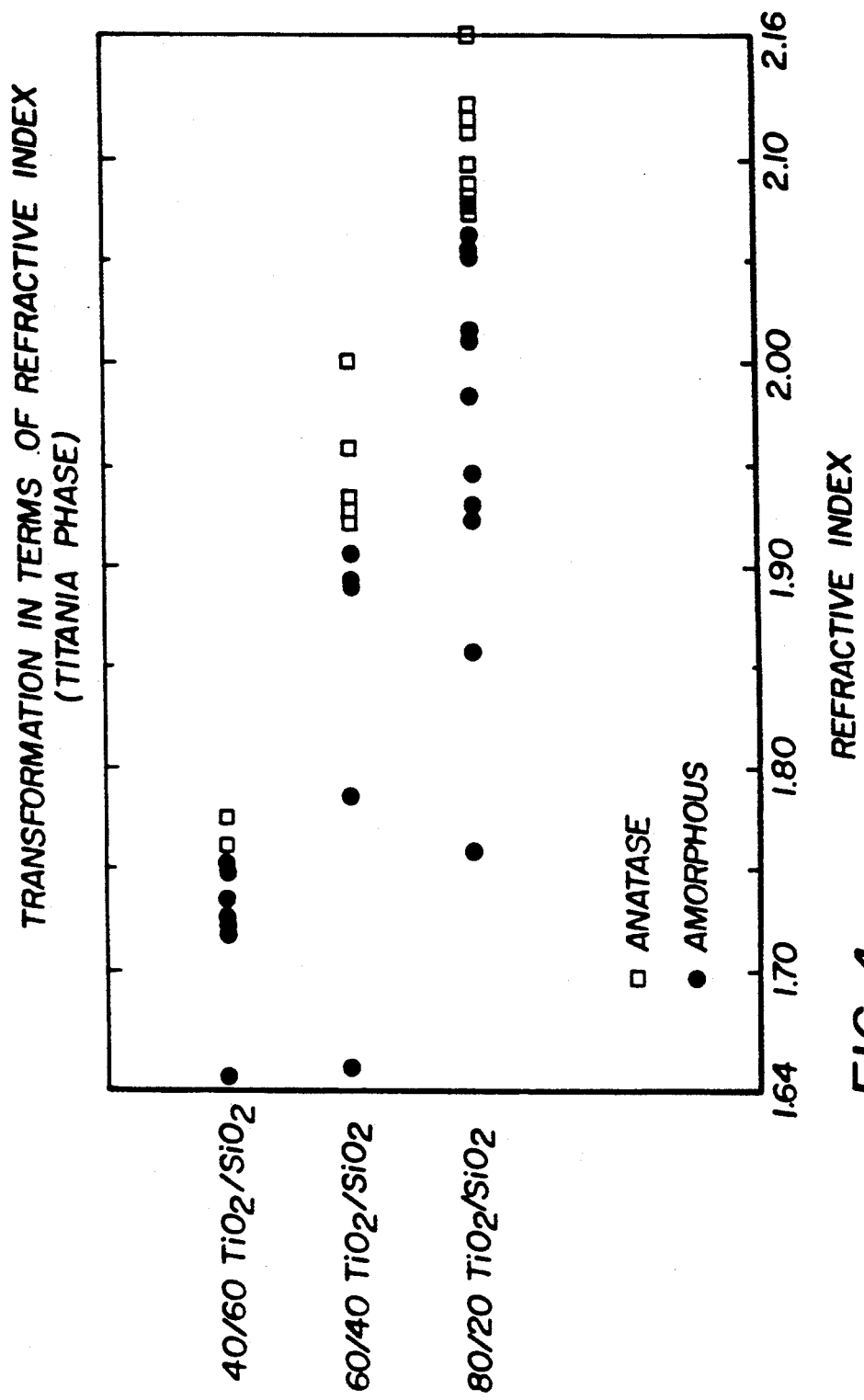
FIG. 4 shows refractive index values for three binary titania silica sol-gel films as a function of phase transformations.

The change in refractive index of three binary titania/silica sol-gels and their phase transformations behavior as a function of thermal processing is included in FIG. 4. The average crystalline size as a function of processing at 700° C. and then 105° C. for 1 hour are illustrated in Table I.

Immediately after spin coating, the films were heated at 5° C. per minute ramp to 150° C., held for 15 minutes and then heated at 3° C. per minute to 175° C. and held for 1 hour in a model 495 Fisher Ashing Furnace. Cooling occurred with the furnace door closed.

Additional heat treatments consisted of a ramped rate of 5° C. per minute to 50° C. less than the desired temperature and 15 minutes hold, followed by a 3° C. per minute ramp to the final temperature with dwell times of 1 to 66 hours. The coatings again returned to room temperature in a closed door furnace.

Figure 5:
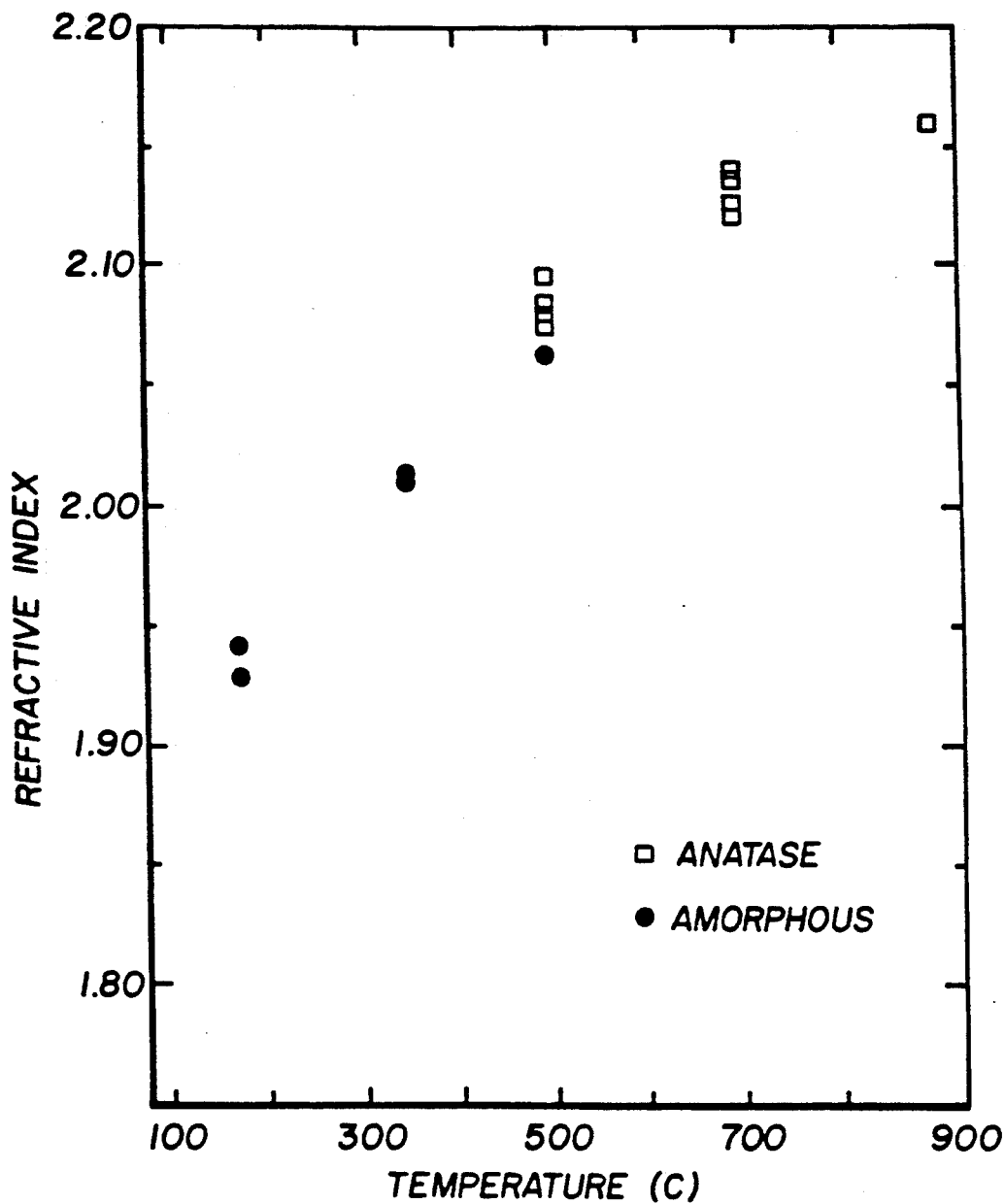
FIG. 5 shows phase transformation temperatures and refractive index of 80/20 titania/silica sol-gel film.

The actual change in refractive indices of the 80-/20 mole % titania/silica SOG films as a function of processing conditions of time and temperature are shown in FIG. 5. A ramped temperature sequence was the same as explained above.

The experiments illustrated that the concentration of silica effected the temperature of phase transformation of the titania. The greater the concentration of silica the higher the transformation temperature necessary to result in the formation of anatase and rutile and also the smaller size the crystallite that was formed at a similar temperature.

TABLE I

| Crystallite sizes measured by XRD | | | |
|---|---|---|---|
| Sample Ratio Titania/Silica | Corrected FWHM (Deg) | Phase | Average Crystalline Size (mm) |
| 700° C. | | | |
| 80/20 | 1.166 | Anatase | 7.0 |
| 60/40 | 1.799 | Anatase | 4.5 |
| 40/60 | | Not Observed | |
| 1050° C. | | | |
| 80/20 | 0.182 | Anatase | 45.0 |
| | 0.145 | Rutile | 56.6 |
| 60/40 | 0.209 | Anatase | 39.0 |
| | 0.167 | Rutile | 49.0 |
| 40/60 | 0.298 | Anatase | 27.5 |
| | 0.269 | Rutile | 30.5 |

The invention has been described in detail with particular reference to certain preferred embodiments thereof, but it will be understood that variations and modifications can be effected within the spirit and scope of the invention.

We claim:

1. In a process for forming an integral dichroic color filter array on an image sensor, comprising the steps of:
   (a) coating a planarization layer on the image sensor;
   (b) sequentially depositing a plurality of spin-on glass layers on the planarization layer, wherein two of such spin-on glass layers have different desired indices of refraction with one including a mixture of titania and silica partially hydrolyzed and condensed sol-gel polymer suspension and the other a partially hydrolyzed and condensed silica sol-gel polymer suspension, and after depositing each layer, heating such layer at a temperature less than 300° C. to remove residual solvent and to achieve a desired refractive index without causing a phase change of titania from amorphous to either crystalline anatase or rutile or a combination thereof; and exposing the layer containing titania to energy selected to cause titania to phase change from amorphous to either crystalline anatase or rutile or a combination thereof to change the spectral response characteristics of the filter.

* * * * *